United States Patent [19]
Blish, II

[11] Patent Number: 6,037,547
[45] Date of Patent: Mar. 14, 2000

[54] VIA CONFIGURATION WITH DECREASED PITCH AND/OR INCREASED ROUTING SPACE

[75] Inventor: Richard C. Blish, II, Saratoga, Calif.

[73] Assignee: Advanced Micro Devices, Inc., Sunnyvale, Calif.

[21] Appl. No.: 08/984,224

[22] Filed: Dec. 3, 1997

[51] Int. Cl.$^7$ .................................................... H05K 1/00
[52] U.S. Cl. ........................... 174/264; 174/265; 29/852; 257/698; 361/777
[58] Field of Search ..................................... 174/262, 263, 174/264, 265, 266; 257/698, 723, 724; 361/748, 777, 779; 29/852; 427/97

[56] References Cited

U.S. PATENT DOCUMENTS 5,784,262  7/1998  Sherman .................................. 361/777

FOREIGN PATENT DOCUMENTS 9-246725  9/1997  Japan .
11-87919  3/1999  Japan .

*Primary Examiner*—Hyung Sub Sough
*Attorney, Agent, or Firm*—LaRiviere, Grubman & Payne, LLP

[57] ABSTRACT

A number of non-circular vias are defined in a printed wiring board layer. The vias are preferably elliptical, with their long dimensions oriented at an angle to the primary axes of the via or grid array. By providing elongated, non-circular vias, it is possible to decrease the pitch of the via array, or provide improved routing of escape traces.

8 Claims, 8 Drawing Sheets

VIA CONFIGURATION WITH DECREASED PITCH AND/OR INCREASED ROUTING SPACE

TECHNICAL FIELD

The present invention relates to a via or plug configuration which permits a smaller pitch between adjacent vias, and/or provides more space between adjacent vias for the routing of traces. This permits semiconductor component packages with large input/output (I/O) counts versus package size to be accommodated on printed wiring boards (PWBs) or printed circuit boards (PCBs) without requiring as many layers in the PWB or PCB as conventional via configurations.

TERMINOLOGY

For the purposes of this specification, the term "printed wiring board" (PWB) shall be interpreted to include "printed circuit board" (PCB), the term "lead" shall be interpreted to include other means of establishing electrical interconnection between a semiconductor package and a substrate to which it is mounted, including solder bumps, tape automated bonding, wire interconnects, conductive polymers, anisotropic conductive adhesives, metallurgy bumps, compliant bumps and pressure contacts. The term via shall be interpreted to include "plated through hole" (PTH).

BACKGROUND OF THE INVENTION

A via is a connecting hole in a PWB which is filled with a conducting material. Vias provide a conducting path for electrically connecting circuits on various layers of the PWB to one another, and also for electrical connection of semiconductor component package leads to the various layers in the PWB. Vias may pass through the PWB, or they may be blind (i.e. they pass from the surface of the PWB to an interior layer of the PWB without passing through to the other side of the PWB), or they may be buried (i.e. they are completely inside the PWB to interconnect interior layers without passing through to either side of the PWB).

It follows therefore that each input/output (I/O) lead on a semiconductor component package, such as a microprocessor or a chip set, is either connected on the surface layer of the PWB to its neighbor component, or is connected by a via using an internal layer on the PWB.

As semiconductor component packages become ever more complex, the number of I/O leads on the package rises to provide the required interconnection for the functionality of the package. Currently, many semiconductor component microprocessor packages have 200 to 330 I/O leads, but this is expected to rise into the thousands before very long. Also, the number of functions per unit area in semiconductor component packages has been increasing exponentially, as the feature size in the component package has decreased.

These continuing trends have meant that an ever increasing number of more closely spaced leads have to be electrically connected to the PWB, to route signals and power to and from the semiconductor component package. This, in turn, has resulted in a decrease in via size and pitch, and has also resulted in an increase in the number of layers required in the PWB.

The problems associated with large I/O count and small I/O pitch have been exacerbated by the pitch mismatch between the fine pitch of array packages, such as flip chip (C4), ball grid array packages (BGA), land grid array packages (LGA) and chip scale packages (CSP), with the coarse pitch PWBs. This pitch mismatch forces the use of large, costly footprint areas for the packages, and/or many extra layers in the PWB to route the I/O connections away from the packages.

A larger package footprint means not only extra cost, but also increased capacitive and inductive loading, which negatively impacts package high frequency performance. Also, overall reliability is decreased due to stresses created in the package, the leads and the PWB, as a result of different coefficients of thermal expansion of the package and the PWB, if the physical size of the package is less than optimal.

Extra layers in the PWB to accomplish routing of the I/O signals are not only costly, but are also potential causes of increased electrical resistance, and decreased reliability. In particular, an increase in the number of layers increases the risk of delamination or fracture in the vicinity of vias or plated through holes (PTH) under the stresses induced by temperature or power cycling.

Also, as via size has decreased, the cost and ease of manufacturing of the vias has increased sharply.

The limiting factors for PWB wiring density are via land size and number, the width of the traces (lines), and the spacing between traces.

SUMMARY OF THE INVENTION

According to the invention there is provided a method of making a printed wiring board comprising the steps of:

providing a printed wiring board layer;

defining a via in the layer, the via having a non-circular cross section with a long dimension along a major axis and a short dimension along a minor axis; and introducing an electrically conductive material into the via.

Preferably, the via is defined in the layer using a process selected from the group consisting of laser drilling, punching, photolithography and etching, and the layer or fiber reinforcement of the printed wiring board is made of aramid.

Also according to the invention there is provided a printed wiring board comprising:

a printed wiring board layer including a via defined in the layer, the via having a non-circular cross section with a long dimension along a major axis and a short dimension along a minor axis; and an electrically conductive material located in the via for transferring electrical signals.

Preferably, there are a number of non-circular vias defined in the printed wiring board layer, the vias each having a cross section with a long dimension along a major axis and a short dimension along a minor axis, the vias being arranged with their major axes oriented at an angle to the primary axes of the via or grid array.

Preferably, the vias are formed in a rectangular array, and the major axes of the vias are aligned at an angle of between 15° and 75°, more preferably between 45° and 75°, and most preferably between 45° and 75°, to one of the major axes of the array.

Other features of the invention are disclosed or apparent in the section entitled "BEST MODE OF CARRYING OUT THE INVENTION".

BRIEF DESCRIPTION OF THE DRAWINGS

For fuller understanding of the present invention, reference is made to the accompanying drawings in the following detailed description of the Best Mode of Carrying Out the Invention. In the drawings.

BEST MODE OF CARRYING OUT THE INVENTION

As semiconductor component packages and printed wiring boards are well known in the art, in order to avoid confusion, while enabling those skilled in the art to practice the claimed invention, this specification omits many details with respect to known items.

Figure 1:
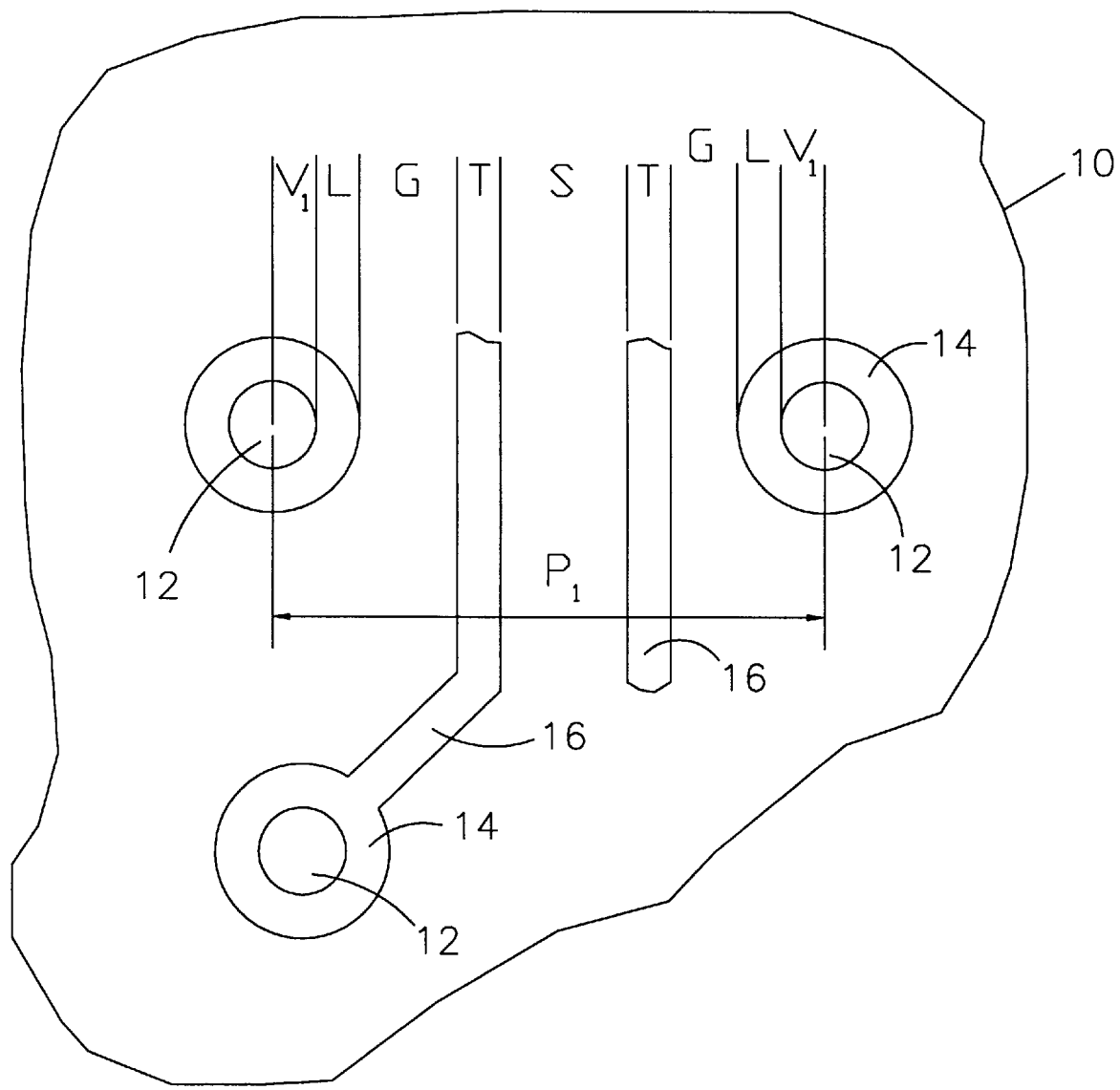
FIG. 1 is a plan view of a portion of the surface of a prior art PWB layer.

To illustrate the advantages of the invention more clearly by way of comparison, the surface of a prior art printed wiring board (PWB) layer is illustrated in FIG. 1. The PWB layer, generally indicated by the numeral 10, is typically one of a number of PWB layers which are laminated together to form a PWB.

Defined in the PWB layer 10 are a number of vias 12, which are filled with an electrically conductive material to provide a conducting path for electrically connecting circuits on various layers of the PWB to one another, and also for electrical connection of semiconductor component package leads to the various layers in the PWB.

On the surface of the PWB layer 10, around each of the vias 12, a land or terminal area 14 is provided. The lands 14 are in the form of a thin layer of conductive material which provides electrical connection between the via 12 and a lead of a semiconductor component package and/or provides electrical connection between the via 12 and a trace 16. The traces 16 are for routing an electrical signal away from the land along the surface of the PWB layer 10. The minimum size of the land 14 is chosen so that, even in the worst case of misregistration of the center of the via 12 and the center of the land 14 during the PWB manufacturing process, the via 12 will still be within the area of the land 14.

In FIG. 1, the pitch $P_1$ between adjacent lands 12 can be determined as follows:

$$P_1 = 2(V_1+L) + 2G + T + (n-1)(T+S)$$

where $V_1$ is the via radius, L is the difference between the land radius and the via radius, G is the width of a guard band between the land 14 and the nearest non-common conductor (the trace 16), T is the trace width, S is the spacing between adjacent traces, and n is the number of traces.

In the case where there is a single trace 16, n=1 and $P_1 = 2(V_1+L) + 2G + T$. In the case where there are no traces between the vias 14, the minimum pitch would be equal to $G + 2(V_1+L)$, as only one guard band is required.

Figure 2:
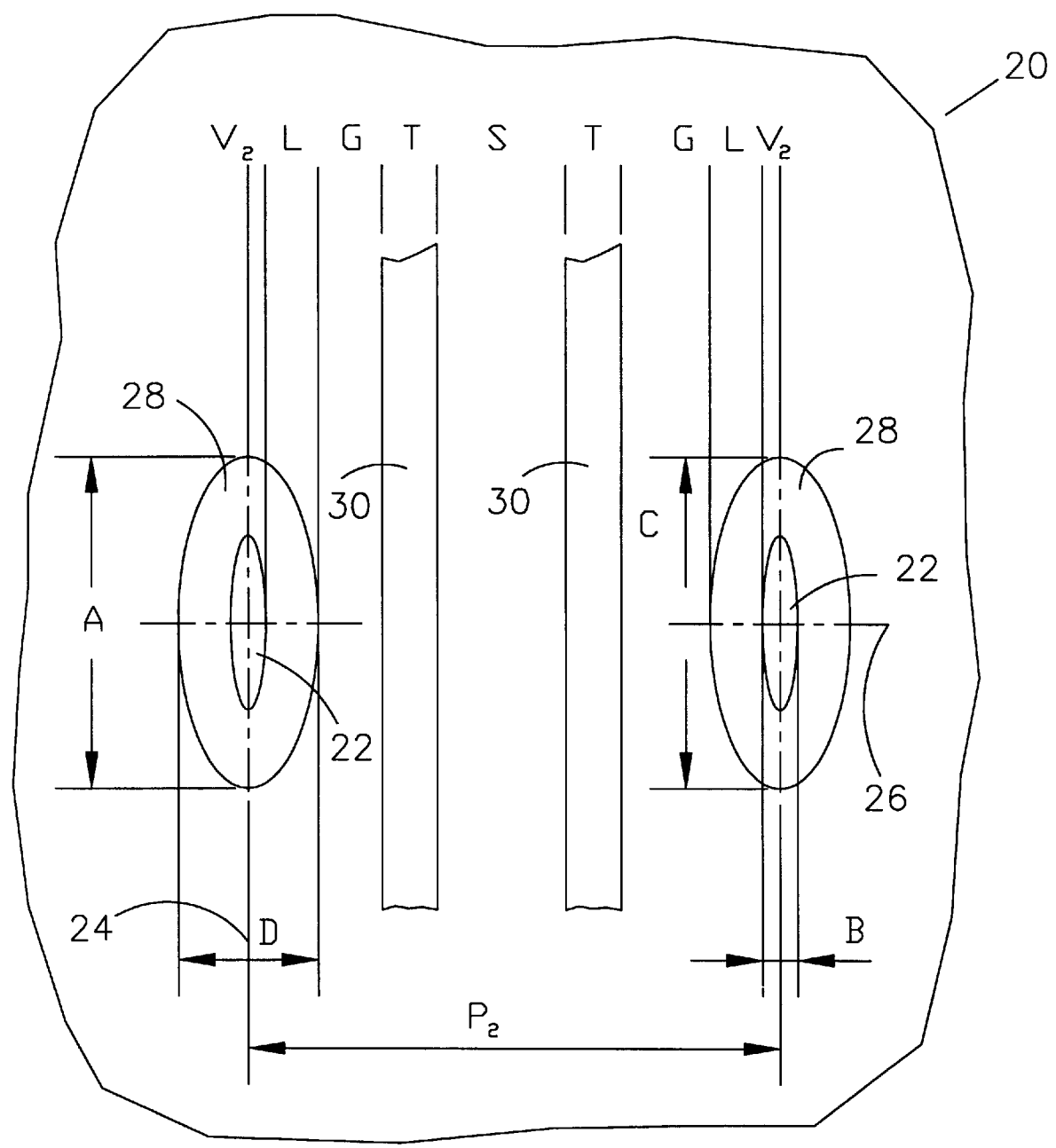
FIG. 2 is a plan view of a portion of the surface of a generalized PWB layer according to the invention.

The via arrangement of the invention is illustrated in FIG. 2, which is a plan view of a portion of the surface of a generalized PWB layer 20 in which the invention has been implemented. Defined in the PWB layer 20 are a number of vias 22, which are filled with an electrically conductive material to provide a conducting path for electrically connecting circuits on various layers of the PWB to one another, and also for electrical connection of semiconductor component package leads to the various layers in the PWB.

As can be seen from the figure, the vias 22 have a cross section which is elongated, having a long dimension A along a major axis 24 and a short dimension B along a minor axis 26. The cross sections of the vias are in fact ellipses, with dimensions which will be discussed in more detail below.

On the surface of the PWB layer 20, around the vias 22, lands or terminal areas 28 are provided. As before, the lands 28 are in the form of a thin layer of conductive material which provides electrical connection between the via 22 and a lead of a semiconductor component package and/or provides electrical connection between the via 22 and a trace. Also as before, traces 30 are provided for electrical signal routing.

As with the vias 22, the lands 28 are non-circular, having a long dimension C along the common major axis 24 and a short dimension D along the common minor axis 26. Stated differently, the major axes of the via 22 cross section and the land 28 are substantially aligned. Also, as with the via 22 cross sections, in the illustrated embodiment, the lands 28 are elliptical in shape.

The minimum size of the land 28 is chosen so that, even in the worst case of misregistration of the center of the via 22 and the center of the land 28 during the PWB manufacturing process, the via 12 will still be within the area of the land 14. Assuming that the possible misregistration of the via 22 and the land is the same as for the prior art arrangement, i.e., by the amount L, the long dimension C of the land will be equal to A+2L, and the short dimension D of the land 28 will be equal to B+2L.

Assuming that the trace thickness T, the trace spacing S and the guard band width G remain unchanged from the prior art arrangement of FIG. 1, the pitch $P_2$ between adjacent lands 22 in FIG. 2 can be determined as follows:

$$P_2 = 2(V_2+L) + 2G + T + (n-1)(T+S)$$

where $V_2$ is half of the via short dimension B.

If no traces pass between the adjacent vias 22, the minimum pitch is:

$$P_2 = 2(V_2+L) + G$$

Subtracting $P_2$ from $P_1$, it can be seen that the via arrangement of the invention has a pitch which is less than the pitch of the prior art arrangement by an amount equal to $2(V_1-V_2)$ which is the difference between the half of the elliptical via's minor axis and the circular via's radius. In the illustrated embodiment, the short dimension B of the via 28 cross section, $2V_2$, is ⅝ of the diameter $2V_1$ of the via 12, that is $V_2 = 0.625\ V_1$. Therefore, substituting into the equation for the difference between $P_2$ and $P_1$ gives: $2(V_1-0.625$ $V_1$) =0.375 $V_1$, that is, the via pitch of the arrangement illustrated in FIG. 2 has been decreased by an amount equal to 37.5% of the radius of a prior art via arrangement.

By way of an example, using typical figures for two vias of the invention having no traces between them, with a guard band G of 0.15 mm, a land dimension L of 0.075 mm and an elliptical via with A'=0.48 mm and B=2$V_2$=0.19 mm, the resulting minimum pitch will be 0.49 mm. Comparing this with a typical prior art circular via of diameter 0.3 mm, the resulting minimum pitch for the same guard band G and land dimension L is 0.6 mm. In this example, the invention thus provides an 18% reduction in the via pitch.

Also, in this example, by making the long dimension A of the ellipse equal to 1.6 times the diameter of the prior art via, and the short dimension B equal to ⅝ of the diameter of the prior art via, the cross sectional areas of the vias of the invention and the prior art are equal, and the resistance per unit depth of the via of the invention is thus unchanged from the prior art via. This is easily verified by comparing the results of the formula for the area of a circle:

$$\Pi r^2 = \Pi(0.15)(0.15) = 0.071 \text{ mm}^2$$

with the results of the formula for the area of an ellipse:

$$\Pi ab = \Pi(1.6r)(5r/8) = \Pi(0.24)(0.095) = 0.071 \text{ mm}^2$$

By providing vias of unchanged resistance, the redesign of a PWB to accommodate the new invention is reduced.

As an alternative to reducing the pitch between vias, the extra space gained between adjacent vias can be used as extra trace routing space.

The discussion above has been confined to a one dimensional analysis of via spacing, that is, only the pitch in one direction (along the minor axis of the elliptical via) has been considered. In FIG. 2, only the pitch $P_2$ in the direction of the short dimension of the elliptical via has been considered. In a close packed ball grid array (BGA), the pitch in the direction of the long axis of the via needs to be considered as well, to ensure a workable solution.

Figure 3:
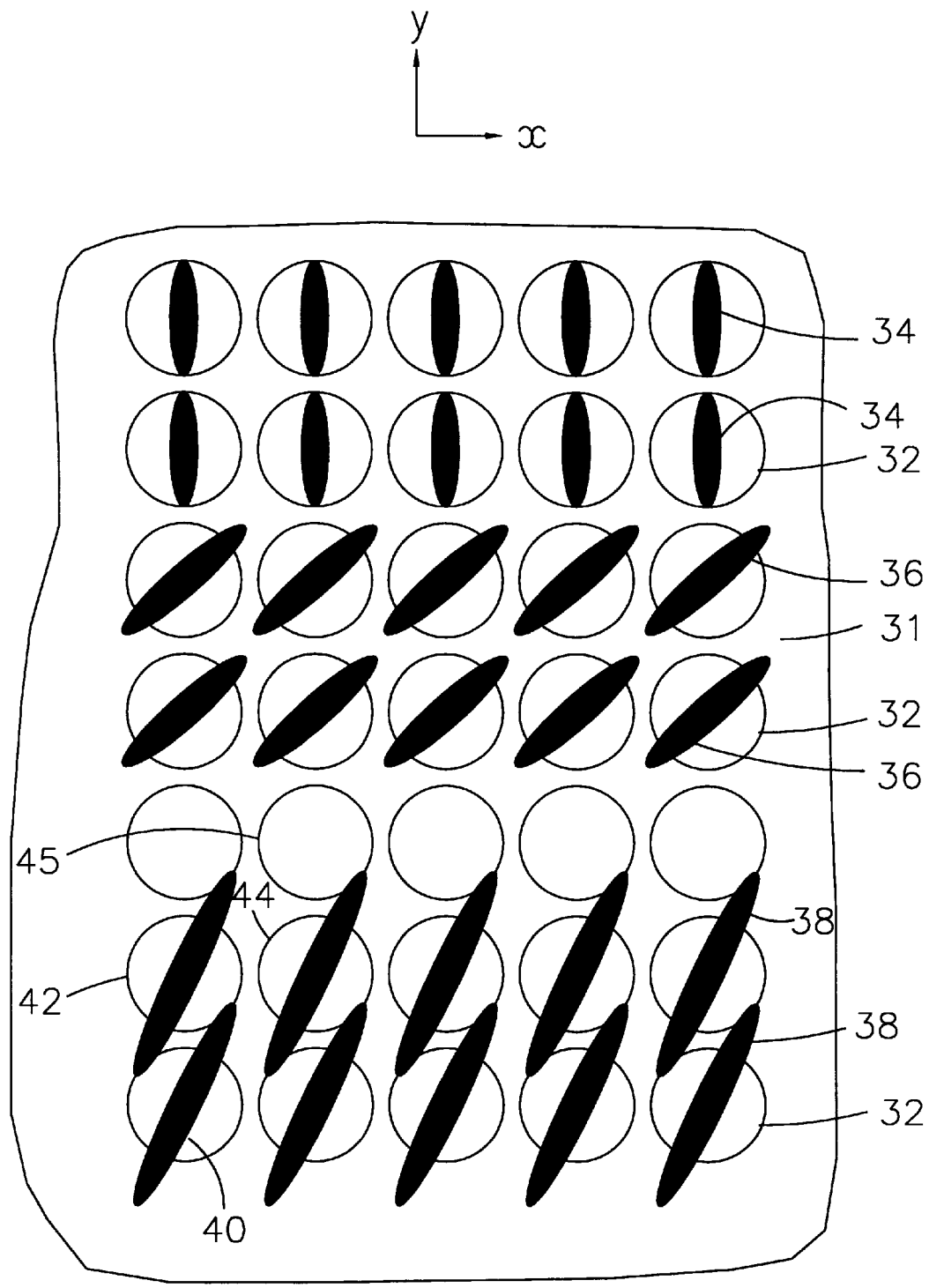
FIG. 3 is a plan view of a portion of the surface of a PWB illustrating various via configurations of the invention for a square grid array of package lands.

The pitch in both x and y axes of a BGA can be considered with reference to FIG. 3. FIG. 3 is a plan view of a portion of a surface 31 of a PWB. A square array of BGA lands 32 is provided for making contact with the solder balls of the BGA package. A number of vias of different orientation and ellipticity are shown. Ellipticity is defined as the ratio of the major axis of an ellipse to the diameter of a circle having the same area as the ellipse. The ellipticity of a circle is therefore 1.0, and the value of ellipticity increases as the ellipse gets longer and thinner. For purposes of illustration only, the ellipticity of the vias illustrated in FIGS. 3 and 4 have been exaggerated to show potential problems along the major axis.

In the upper portion of FIG. 3, a number of vias 34 which have moderate ellipticity are shown. The vias 34 have their major axis or long dimension aligned with the y-axis of the land 32 array, and have their minor axis or short dimension aligned with the x-axis of the land 32 array. From a review of the vias 34, it will become immediately apparent that, as the short dimension of the via is decreased to accommodate a fine pitch in the x-direction, the vias 34 extend towards each other in the y direction, either requiring an increase in pitch of the lands 32 in the y direction, or violating good design practices in the y dimension (i.e. potential shorting).

To overcome this problem, the vias of the invention are oriented at an angle to the BGA land's orthogonal x- and y-axes. This is illustrated in the central portion of FIG. 3, where a number of vias 36 are shown. The vias 36 have an increased ellipticity compared to the vias 34, and are oriented with their major axes at 45° to the x- and y-axes of the BGA. By aligning the vias 36 so that the major axes of the vias 36 are pointed at the second nearest neighboring land, the theoretical distance available for the long dimension of an elliptical via is increased from the nominal pitch P to the square root of two times P (1.414 P), an increase of over 40% in the distance available for the long dimension of the elliptical via. For purposes of illustration only, it can be seen that the vias 36 have an increased ellipticity (i.e. they are more pronounced ellipses) than the vias 34, and yet the tips of the vias 36 are a similar distance apart when compared to the vias 34.

The arrangement of the vias 36 still does not provide a theoretically optimal solution, since the vias 36 are aligned such that, in the limit, the tips of the second to nearest vias will touch. To provide the theoretically optimal solution, the vias are aligned as shown in the lower portion of FIG. 3. In this case, the vias 38 are aligned such that the major axes of the vias point at the center of the fourth to nearest neighbor. That is, the via 40 points at the center of the via (not shown) in the land 45. Alternatively stated, the major axis of the via 40 bisects a line between the center of the land 42 located directly above the via 40 and the land 44 which is the second to nearest neighbor of the via 40. The major axes of the vias 38 thus lie on the hypotenuse of a right triangle which has the dimensions of 2 units in the y direction, 1 unit in the x direction, and a hypotenuse of √5 units. That is, the major axis of each via 38 is at an angle of 63.4° to the x-axis.

This theoretically optimal configuration itself has limitations. In the limit, it is no longer only the tips of the vias 38 which approach each other, but also the sides of the adjacent vias 38 between the major and minor axes. Accordingly, ensuring that the vias 38 are not too close together at any location while optimizing the pitch of the lands 32 is a multidimensional problem which depends on both the via area, the via ellipticity, the pitch between vias, and the orientation of the via itself. Determining the minimum isolation distance for a particular via configuration according to the invention will thus be a parametric, closed form calculation which depends on the parameters of the particular application.

To provide a complete disclosure of the invention, the graphs shown in FIGS. 5 to 8 illustrate the effects of various parameters on the via configuration.

Figure 4:
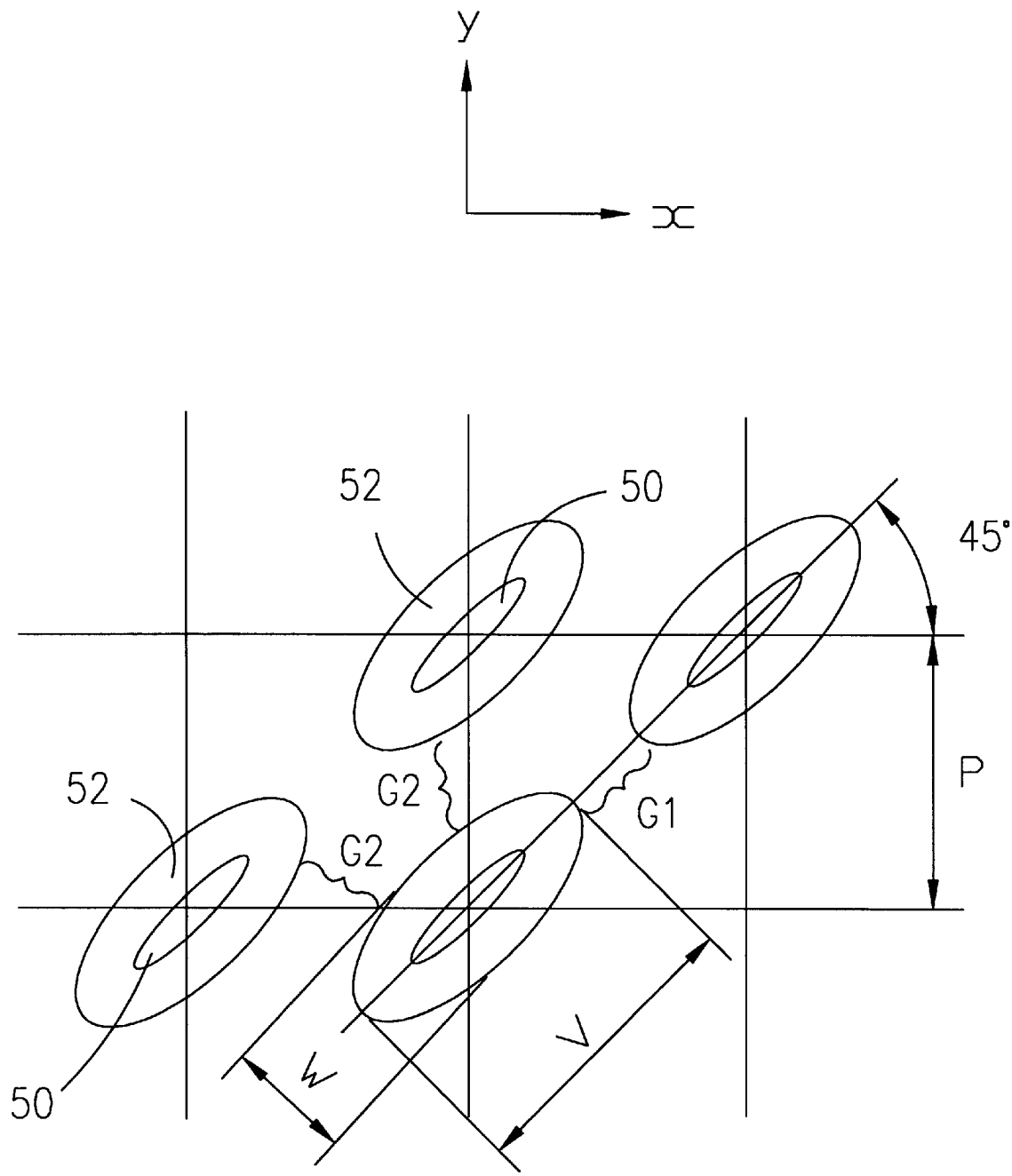
FIG. 4 is plan view of a via configuration of the invention with the major axes of the vias aligned at 45° to the major axes of a square grid array of package lands.

Referring firstly to FIG. 4, a number of vias 50 which are aligned at 45° to the square grid of the solder ball of a conventional BGA package are shown. Surrounding each via 50 is a via land 52. The clearance between adjacent via lands 52 in the 45° direction is shown as G1, and the clearance in x and y directions are show as G2. Due to the symmetry of the arrangement about the 45° line, it is not necessary to distinguish between the clearance in the x direction and the clearance in the y direction. The major dimension of each via land 52 is shown as V, and the minor dimension of each via land is shown as W, and the pitch of the square array is shown as P.

Figure 5:
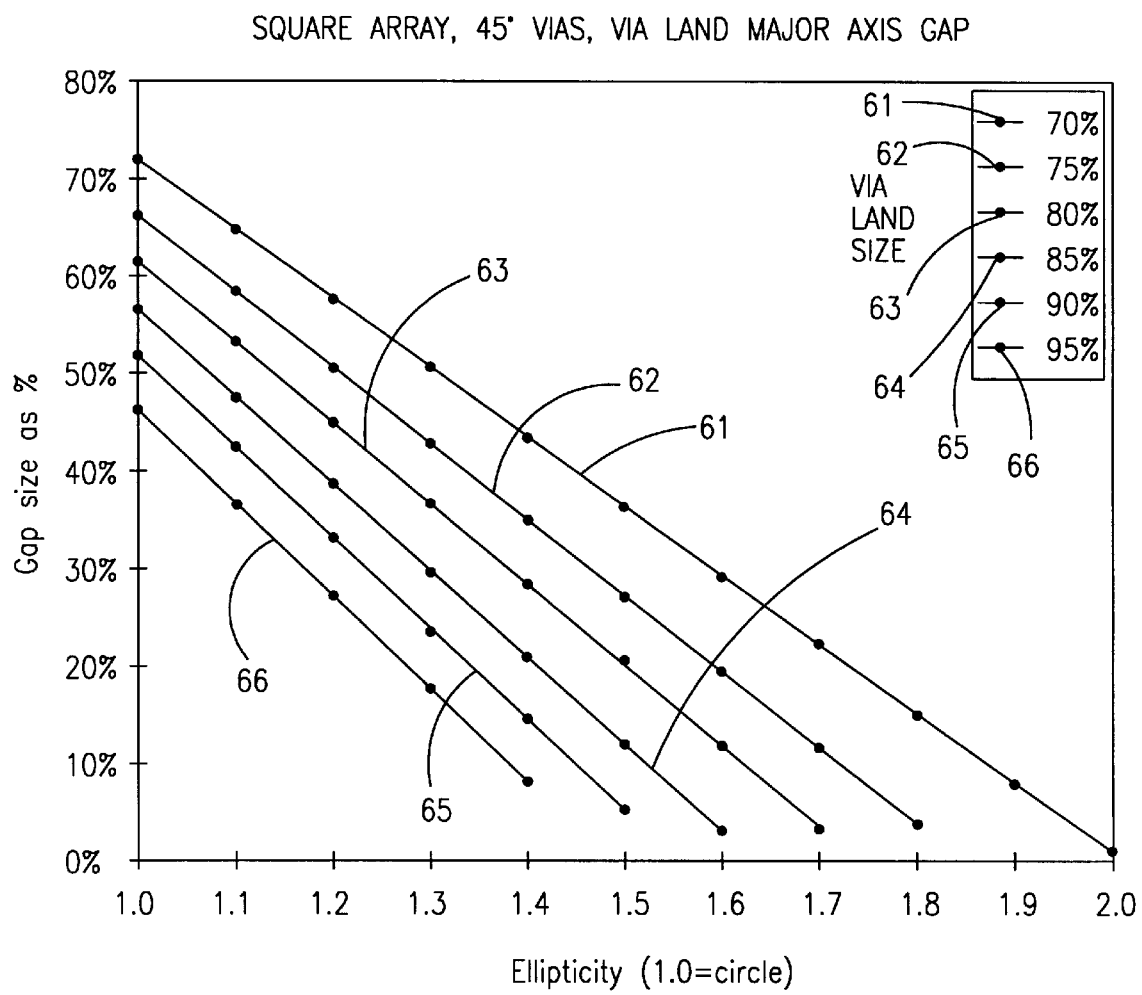
FIG. 5 is a graph illustrating the relationship between ellipticity, 45° gap size and via land size for the via configuration of FIG. 4.

Referring now to FIG. 5, the relationship between the ellipticity, via land size (area) and the size of the 45° gap G1 is shown. On the y-axis, the gap size G1 is shown as a percentage of the pitch P. On the x-axis, the ellipticity is plotted, from 1.0 (a circle with V=W) to 2.0, where V is twice the original circular via land diameter and W is half the original circular via land diameter. Six different curves (61 to 66) are plotted for different via land sizes, with the uppermost curve 61 representing an ellipse whose size is based on a circle with a diameter of 70% of the pitch P, and the lowermost curve 66 representing an ellipse whose size is based on a circle with a diameter of 95% of the pitch P.

Considering a specific example, for a pitch P of 0.5 mm and a circular via land diameter D of 0.35 mm (70% of P, ellipticity of 1.0), the gap size G1 will be just over 70% of the pitch P, or approximately 0.36 mm. Increasing the ellipticity to 1.2, the gap size G1 decreases to just below 60% of P, or 0.3 mm, with V=1.2* D=0.42 and W=D/1.2= 0.29 mm.

As can be expected, as the via lands 52 extend towards each other in the 45° direction with increasing ellipticity, the gap size decreases. Also, as the via lands are based on larger and areas, the gap G1 decreases.

Figure 6:
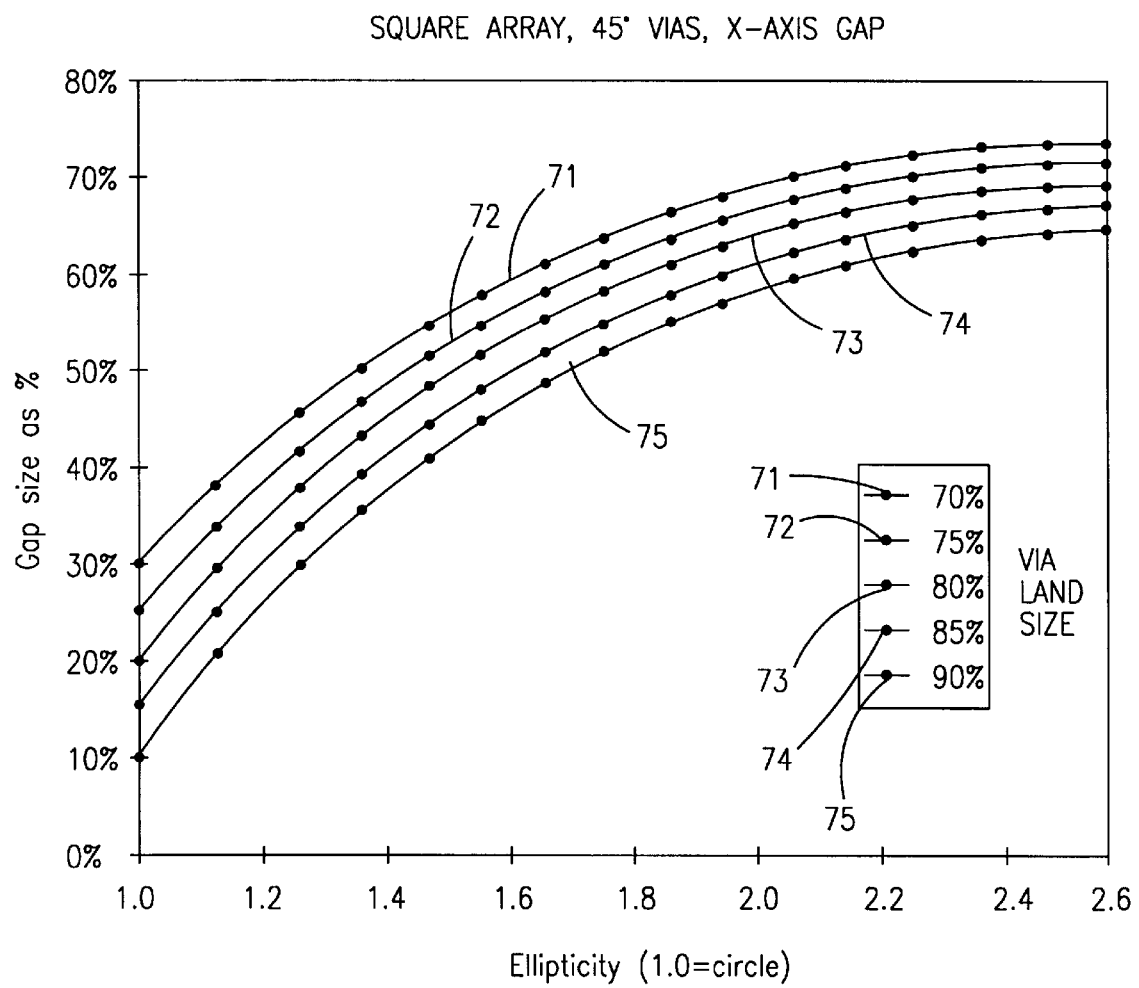
FIG. 6 is a graph illustrating the relationship between ellipticity, grid array major axis gap size and via land size for the via configuration of FIG. 4.

Referring now to FIG. 6, the relationship between the ellipticity, the via land size and the size of the x and y direction gap G2 is shown. As before, on the y-axis, the gap size G1 is shown as a percentage of the pitch P. On the x-axis, the ellipticity is plotted, from 1.0 (a circle with V=W), to 2.6, where V is 2.6 times the original circular via land diameter and W is the original circular via land diameter divided by 2.6. Five different curves (71 to 75) are plotted for different via sizes, with the uppermost curve 71 representing an ellipse whose size is based on a circle with a diameter of 70% of the pitch P, and the lowermost curve 75 representing an ellipse whose size is based on a circle with a diameter of 90% of the pitch P.

Considering again the specific example described above with reference to FIG. 5, for a pitch P of 0.5 mm and a circular via land diameter D of 0.35 mm (70% of P, ellipticity of 1.0), the gap size G2 will be 30% of the pitch P, or 0.15 mm. Increasing the ellipticity to 1.4, the gap size G2 increases to approximately 50% of P, or 0.25 mm, with V=1.4 * D=0.49 mm and W=D/1.4=0.25 mm.

As can be expected, as the via lands 52 extend towards each other in the 45° direction with increasing ellipticity, the gap size G2 increases. As the via lands are based on larger and larger areas, the gap G2 decreases as before.

Figure 7:
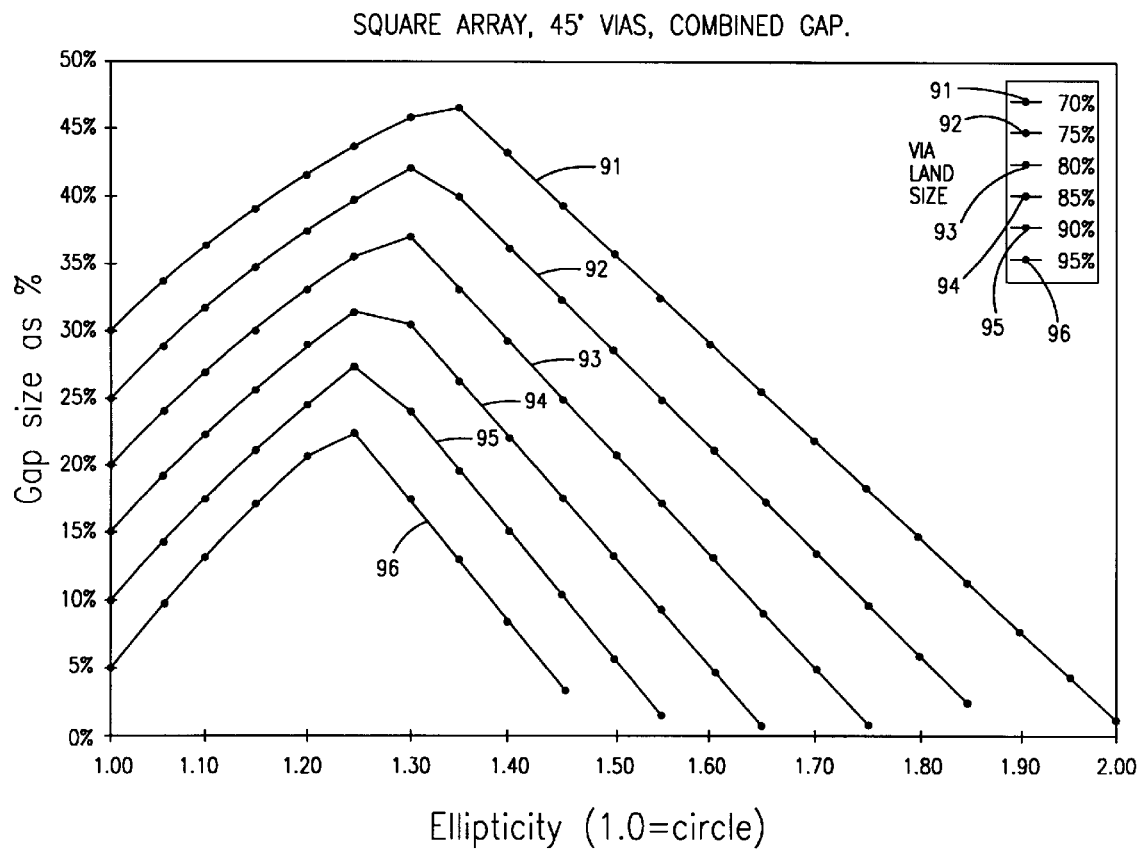
FIG. 7 is a graph combining the minimum gap sizes of FIGS. 5 and 6 to illustrate the approximate overall minimum gap sizes for the via configuration of FIG. 4.

Combining the data points of the smallest gap sizes from FIGS. 5 and 6 into a single graph yields FIG. 7, which is a good approximation of the minimum clearance around the via lands 52, taking into account the interplay between the improvement in gap size on the major axis and the degradation of the gap size along the minor axis and conversely. Six different curves (91 to 96) are plotted for different via sizes, with the uppermost curve 91 representing an ellipse whose size is based on a circle with a diameter of 70% of the pitch P, and the lowermost curve 96 representing an ellipse whose size is based on a circle with a diameter of 95% of the pitch P.

From FIG. 7, it can be seen that significant improvements in gap size are found in a range of ellipticities from about 1.1 to about 1.5, with the maximum clearances between the via lands being found in a range of ellipticities from about 1.25 to about 1.35, the maximum clearance in any particular case being dependent on the via land size as well as the ellipticity. For example, with a via land which is based on a circle with a diameter of 80% of the pitch, the maximum clearance of approximately 35% of the pitch is found at an ellipticity of just over 1.3, for an ellipse with major/minor axes aligned at 45° to the x and y axes of the square array.

Figure 8:
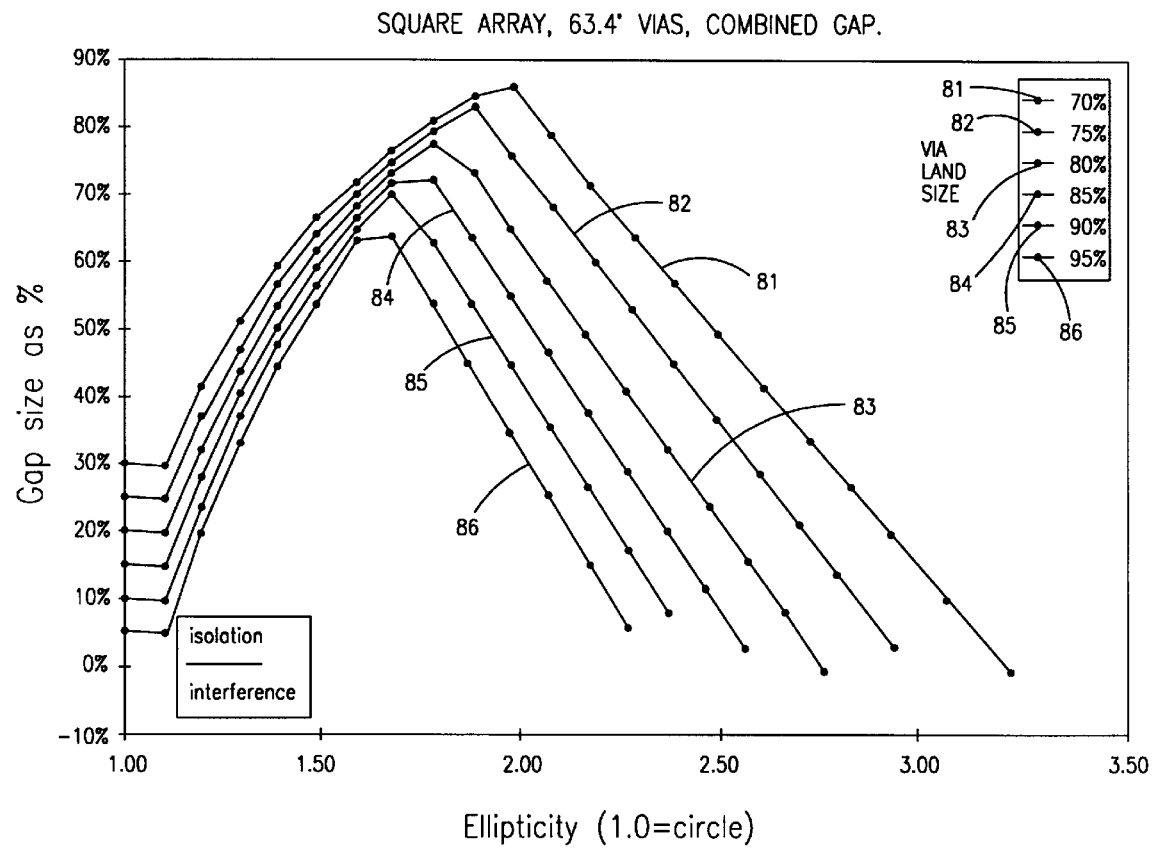
FIG. 8 is a graph showing the approximate overall minimum gap sizes for a square grid array if the major axes of the via are aligned at 63.4° to the x or y axis of the grid array.

In the case where the major axes of the vias are aligned at 63.4° to the x or y axis, and performing the same calculations and combining the data points for the minimum gaps as above, yields FIG. 8. FIG. 8 is a combination of y axis gap and major axis gap as in FIG. 7. Six different curves (81 to 86) are plotted for different via sizes, with the uppermost curve 81 representing an ellipse whose size is based on a circle with a diameter of 70% of the pitch P, and the lowermost curve 86 representing an ellipse whose size is based on a circle with a diameter of 90% of the pitch P. From FIG. 8 it can be seen that the maximum gap size or clearance has increased compared to FIG. 7 for each of the via land sizes, and also that the peaks of the gap size have moved further up the ellipticity axis, with gap size being maximized for ellipticities in the range from about 1.7 to 2.0.

It will be appreciated from the above discussion that many different via configurations are possible. In almost all cases, the particular via configuration will depend on the particular configuration of the semiconductor package (BGA, LGA, CSP, solder ball pitch etc.). However, for a BGA package with a square array with a pitch of 0.5 mm, the best mode of the invention is as follows:

The best mode elliptical via land for the square array is aligned at 63.4° to the x or y axis of the square array. Considering firstly a circular via land diameter of 0.45 mm (90% of P) and a via diameter of 0.3 mm, and requiring a gap (i.e. the guard band discussed with reference to FIGS. 1 and 2) of 0.15 mm (i.e. 30% of P), it can clearly be seen from FIG. 8, curve 85, that a circular via (i.e. ellipticity of 1.0) violates the required gap of 0.15 mm, as the resulting gap will be 10% of P, or 0.05 mm. However, from curve 85, the 90% via land curve (worst case) in FIG. 8, it can be seen that the gap size is greater than 30% of the pitch at ellipticities of between 1.25 and 2.8. Selecting an ellipticity of 1.25 to provide a via land of moderate ellipticity, the via land has a major dimension of 0.56 mm and a minor dimension of 0.36 mm. The via itself thus has a major dimension of 0.41 mm and a minor dimension of 0.21 mm, keeping the width of the land around the via constant at 0.075 mm. The area of the resulting via, at 0.068 mm$^2$ is slightly less than the area of the circular via, at 0.071 mm$^2$, on which the dimensions are based. The slight area mismatch can be explained by the fact that the via land was manipulated using the ellipticity, as opposed to the via itself. This area mismatch can easily be cured, if required, by adjusting the via in a non critical direction. In this case, the major dimension of the via can be increased to 0.43 mm, as the minor dimension is the critical dimension in this case.

Thus the fine pitch of the BGA package has been accommodated by the via configuration of the invention.

The best mode vias of the invention are manufactured using any means capable of defining a non-circular holes, such as laser drilling, punching, photolithography and etching.

Further, the electrically conductive media is introduced into the via using conventional means, such as by screen printing, the use of a doctor blade, or by injection.

Finally, the preferred material for forming the layers of the PWB is aramid or other high strength organic fiber.

It will be appreciated that many modifications can be made to the embodiments described above without departing from the spirit and the scope of the invention.

What is claimed is:

1. A method of making a printed wiring board comprising the steps of:
   providing a printed wiring board layer;
   defining a plurality of vias in the layer, each via having a non-circular cross section, wherein each via cross section is elongated, having a long dimension along a major axis and a short dimension along a minor axis; and
   introducing an electrically conductive material into the vias, wherein vias are formed in an array having major axes, the major axes of the vias being aligned at an acute angle to one of the major axes of the array, wherein the vias are formed in a rectangular array, and the major axes of the vias are aligned at an angle of between 15° and 75° to one of the major axes of the array, wherein the vias have an ellipticity in the range of 1.1 to 1.5.

2. The method of making a printed wiring board according to claim 1, wherein the vias have an ellipticity in the range of 1.25 to 1.35.

3. A method of making a printed wiring board comprising the steps of:

providing a printed wiring board layer;

defining a plurality of vias in the layer, each via having a non-circular cross section, wherein each via cross section is elongated, having a long dimension along a major axis and a short dimension along a minor axis; and introducing an electrically conductive material into the vias, wherein the vias are formed in an array having major axes, the major axes of the vias being aligned at an acute angle to one of the major axes of the array, wherein the vias are formed in a rectangular array, and the major axes of the vias are aligned at an angle of between 15° and 75° to one of the major axes of the array, wherein the vias have an ellipticity in the range of 1.1 to 2.0.

4. The method of making a printed wiring board according to claim 3, wherein the vias have an ellipticity in the range of 1.7 to 2.0.

5. A printed wiring board comprising:

a printed wiring board layer including a plurality of vias defined in the layer, each via having a non-circular cross section, wherein each via cross section is elongated, having a long dimension along a major axis and a short dimension along a minor axis; and an electrically conductive material located in the vias for transferring electrical signals, wherein the vias are formed in an array having major axes, the major axes of the vias being aligned at an acute angle to one of the major axes of the array, wherein the vias are formed in a rectangular array, and the major axes of the vias are aligned at an angle of between 15° and 75° to one of the major axes of the array and, wherein the vias have an ellipticity in the range of 1.1 to 1.5.

6. The printed wiring board according to claim 5, wherein the vias have an ellipticity in the range of 1.25 to 1.35.

7. A printed wiring board comprising:

a printed wiring board layer including a plurality of vias defined in the layer, each via having a non-circular cross section, wherein each via cross section is elongated, having a long dimension along a major axis and a short dimension along a minor axis; and an electrically conductive material located in the vias for transferring electrical signals, wherein the vias are formed in an array having major axes, the major axes of the vias being aligned at an acute angle to one of the major axes of the array, wherein the vias are formed in a rectangular array, and the major axes of the vias are aligned at an angle of between 15° and 75° to one of the major axes of the array and, wherein the vias have an ellipticity in the range of 1.1 to 2.0.

8. The printed wiring board according to claim 7, wherein the vias have an ellipticity in the range of 1.7 to 2.0.

* * * * *